United States Patent
Alavi et al.

(10) Patent No.: US 7,196,349 B2
(45) Date of Patent: Mar. 27, 2007

(54) RESONANT CAVITY ENHANCED MULTI-QUANTUM WELL LIGHT MODULATOR AND DETECTOR

(75) Inventors: Kambiz Alavi, Grapevine, TX (US); Joseph Pellegrino, Woodbridge, VA (US); Patrick G Maloney, Arlington, VA (US); F. Elliott Koch, Moorpark, CA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 119 days.

(21) Appl. No.: 11/060,191

(22) Filed: Feb. 17, 2005

(65) Prior Publication Data

US 2006/0180830 A1 Aug. 17, 2006

(51) Int. Cl.
*H01L 31/00* (2006.01)
(52) U.S. Cl. ................ 257/21; 257/E31.033; 438/47
(58) Field of Classification Search .............. 257/14, 257/21, 186, E33.008, E33.01, E31.033, 257/E31.036, E29.072, E29.078; 359/240, 359/291, 248; 438/46, 47
See application file for complete search history.

(56) References Cited

U.S. PATENT DOCUMENTS

| | | | | |
|---|---|---|---|---|
| 5,105,301 | A * | 4/1992 | Campi | 359/245 |
| 5,229,878 | A * | 7/1993 | Tomita et al. | 359/248 |
| 5,298,762 | A * | 3/1994 | Ou | 257/13 |
| 5,521,742 | A * | 5/1996 | Ishimura | 359/248 |
| 5,543,629 | A * | 8/1996 | Nakamura et al. | 257/21 |
| 5,621,564 | A * | 4/1997 | Kageyama et al. | 359/248 |
| 5,854,090 | A * | 12/1998 | Iwai et al. | 438/47 |
| 6,028,323 | A * | 2/2000 | Liu | 257/21 |
| 6,580,736 | B1 | 6/2003 | Yoshie et al. | |
| 6,956,232 | B2 * | 10/2005 | Reynolds | 257/14 |
| 6,989,550 | B2 * | 1/2006 | Nakahara et al. | 257/14 |
| 2004/0070810 | A1 * | 4/2004 | Yu et al. | 359/248 |
| 2004/0213313 | A1 | 10/2004 | Akulova et al. | |

OTHER PUBLICATIONS

Stievater, T.H.; Rabinovich, W.S.; Goetz, P.G.; Mahon, R.; Binari, S.C., "A surface-normal coupled-quantum-well modulator at 1.55 /spl mu/m," Photonics Technology Letters, IEEE, vol. 16, Issue 9, Sep. 2004 pp. 2036-2038.*
Kiziloglu, Kursad et al., "InP-Based High Sensitivity pin / HEMT / HBT Monolithic Integrated Optoelectronic Receiver", pp. 1-4. No Date Cited.
Emsley, Matthew et al., "High-Efficiency, 10 GHz Bandwidth Resonant-Cavity-Enhanced Silicon Photodetectors Operating at 850 nm Wavelength", pp. 1-2.No Date Cited.
Tyson, Robert K. et al., "Microelectromechanical system programmable aberration generator for adaptive optics", Applied Optics, May 1, 2001, pp. 2063-2067, vol. 40 No. 13, Optical Society of America.

* cited by examiner

*Primary Examiner*—Eugene Lee
*Assistant Examiner*—William Kraig
(74) *Attorney, Agent, or Firm*—Maine & Asmus (57) ABSTRACT

Multi-quantum well (MQW) spatial light modulator devices are disclosed that are capable of achieving reasonable quantum efficiencies and high contrast ratios in order to close an optical communication link by resolving the logical on or off state. The device both modulates and detects light through the use of the quantum well design and resonant cavity enhancement. Based on the materials (e.g., InGaAs/InAlAs) and their band structures, this device can be configured to communicate in the eye-safe wavelength range (e.g., 1550±20 nm). The device can be fabricated using standard photolithographic processes such as molecular beam epitaxy (MBE) and inductively coupled plasma (ICP) reactive ion etching (RIE).

19 Claims, 3 Drawing Sheets

Fig. 1

| Layer No. | Layer | Material | In% | Al% | Ga% | Thickness (Å) | Dopant | Carrier Density | Repeat |
|---|---|---|---|---|---|---|---|---|---|
| 9 | p-Cap | InGaAs | 53.2 | - | 47.1 | 500 | Be | 2.0e19 | - |
| 8 | p-Contact B | InAlAs | 52.1 | 47.9 | - | 3500 | Be | 2.0e19 | - |
| 7 | p-Contact A | InAlAs | 52.1 | 47.9 | - | 3500 | Be | 3.0e18 | - |
| 6 | i-Spacer | InAlAs | 52.1 | 47.9 | - | 500 | undoped | - | - |
| 5 | i-Barrier | InAlAs | 52.1 | 47.9 | - | 85 | undoped | - | 75x |
| 4 | i-Well | InGaAs | 52.9 | - | 47.1 | 75 | undoped | - | |
| 3 | i-Barrier | InAlAs | 52.1 | 47.9 | - | 500 | undoped | - | - |
| 2 | n-Contact | InAlAs | 52.1 | 47.9 | - | 13450 | Si | 3.0e18 | - |
| 1 | Etch Stop | InGaAs | 52.9 | - | 47.1 | 1000 | Si | 3.0e18 | - |
| 0 | Buffer | InAlAs | 52.1 | 47.9 | - | 1000 | Si | 3.0e18 | - |
| | Substrate | 3" InP | - | - | - | - | DSP SI | - | - |

RESONANT CAVITY ENHANCED MULTI-QUANTUM WELL LIGHT MODULATOR AND DETECTOR

STATEMENT OF GOVERNMENT INTEREST

Portions of the present invention may have been made in conjunction with Government funding under contract number F33615-02-C-1252 (CDRL A001), and there may be certain rights to the Government.

FIELD OF THE INVENTION

The present invention relates to multi-quantum well (MQW) technology, and more particularly to a resonant cavity enhanced multi-quantum well light modulator and detector.

BACKGROUND OF THE INVENTION

High speed temporal and spatial modulators are at the heart of many optical fiber and free space communication systems. The 1.55 μm region of the spectrum is most suitable for both optical fiber as well as free space communication, because 1.55 μm represents the lowest dispersion and low loss region of optical fibers, as well as being in the eye safe region of the infrared spectrum. As such, there is an emerging application for modulators in free space optical communications in the range of 1.55 μm. During the last decade or two, there has been a significant push for the development of optical free space communications, due to the advancement of lasers and compact optical systems. Therefore, there is a demand for modulator technologies enabling high bandwidth for insertion into free space optical connections.

Technologies such as liquid crystal spatial light modulators and microelectromechanical systems (MEMS) deformable mirror aberration generators are limited by the intrinsic switching speeds of the material from which they are fabricated, and are only capable of modulation rates between 10 and 100 kHz. Multi-quantum well (MQW) light modulators, on the other hand, are better suited for use in high speed modulation systems.

In particular, reverse biased p-i-n structures based on III–V MQW structures are ideal for use as high speed modulators for the 1.55 μm and other near IR wavelengths. Modulation rates of small III–V MQW devices have been measured to be greater than 10 GHz resulting in bit transfer rates between 1 and 10 Mbps. Also, MQW devices can be designed to operate at specific wavelengths, due to the inherent quantum mechanical properties of a quantum well growth. However, conventional MQW p-i-n modulator devices have only achieved intensity ON/OFF contrast ratios of approximately 1.7:1. Realization of an optical communication link requires significantly higher contrast ratios than those previously achieved.

What is needed, therefore, are MQW devices grown to operate in the "eye-safe" region of the IR spectrum, and that are capable of achieving reasonable quantum efficiencies and high contrast ratios in order to close a communication link by resolving the logical on or off state. In a more general sense, there is a need for technologies that enable high bandwidth free space optical communications.

SUMMARY OF THE INVENTION

One embodiment of the present invention provides a modulating reflector optical communication device for realizing an optical communication link. The device generally includes an InAlAs n-region contact layer, an i-region configured to absorb light at a target wavelength and having a stack of InGaAs quantum well layer and InAlAs barrier layer cycles on the n-region contact layer, and an InAlAs p-region contact layer on the stack. The thicknesses of the stack and contact layers provide an overall resonant optical cavity that enhances contrast ratio at the target wavelength, thereby allowing logical on and logical off states of the device to be resolved so as to enable an optical communication link.

The p-region contact layer may include a superlattice structure. In one particular case, the superlattice structure has first and second InAlAs layers, each 3,000 to 4,000 Å thick. The first InAlAs layer closest to the stack can have a carrier density that is higher than that of the second InAlAs layer. The n-region contact layer can be 10,000 to 15,000 Å thick. The stack includes, for example, a first InAlAs barrier layer on the n-region contact layer that is 450 to 550 Å thick, followed by alternating InGaAs quantum well and InAlAs barrier layers each having thicknesses between 55 to 125 Å thick. The i-region may include an InAlAs spacer layer that is grown on the last InAlAs barrier layer in the stack, and is, for example, 450 to 550 Å thick.

The device may further include an InGaAs etch stop layer upon which the n-region contact layer is grown, wherein the etch stop layer is doped similarly to the n-region contact layer and is 500 to 1500 Å thick. The device may include an InGaAs p-cap layer on the p-region contact layer (e.g., 450 to 550 Å thick). The device may further include a first metal contact associated with the n-region contact layer, and a second metal contact associated with the p-region contact layer that also operates as a reflector. Note that this second metal contact/reflector (e.g., gold) can be deposited or otherwise fabricated on the p-cap layer.

Each of the layers can be epitaxially grown (e.g., molecular beam epitaxy) or otherwise fabricated using conventional semiconductor processing techniques. The device can operate in a detection mode until light is received from a remote node, and then switch to a modulation mode, where the device is biased at a given frequency thereby modulating light that is reflected back to the remote node. In the detection mode, the device can be, for example, in a non-biased or reversed biased state, and in the modulation mode the device can be reverse biased at the given frequency.

In one particular application, the target wavelength is in the range of 1550±20 nm. The contrast ratio can be, for example, 5:1 or better within the 1550±20 nm wavelength range.

In a retro-reflector embodiment, a retro-reflector optics section is coupled with the modulating reflector device thereby allowing the operation of retro-reflectivity.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Embodiments of the present invention provide multi-quantum well (MQW) spatial light modulator devices that are capable of achieving reasonable quantum efficiencies and high contrast ratios in order to close a communication link by resolving the logical on or off state.

In one particular configuration, an InGaAs/InAlAs MQW modulating reflector device is disclosed that not only modulates light, but also detects light due to its p-i-n structure. Furthermore, the resonant cavity enhancement (RCE) coupled with the quantum wells' specially designed absorption allows this device to work in the eye-safe wavelength region (e.g., 1550±20 nm). The devices can be grown using conventional semiconductor processes, such as molecular beam epitaxy (MBE).

The resulting modulating reflector device is capable of a high data rate and modulation of 1.546 μm light at greater than 30 MHz on a 0.0625 mm² (250 μm×250 μm) pixel with a contrast ratio of better than 5:1 with a 20 volt applied bias. Electrical and spectral testing indicate that a 0.0625 mm² pixel would require about 1 mW of power to turn "on" and "off" at a rate of 1 MHz. "Smart" pixel capability is provided by virtue of the photosensitivity inherent from material design enabling the modulator to act as its own detector. A further aspect of the invention combines the optical components for a retro-reflector, which is known in the art, thereby producing a modulating retro-reflector device.

Driver electronics query pixels until one of the pixels detects an input signal (e.g., 1.55 μm continuous wave laser from an external source), and then modulates the signal returning a data packet through the reflector. The combination of this modulating reflector with retro-reflector optics provides the capability for a laser communications system to include terminals that only modulate when activated by the laser energy of the interrogating laser beam, thereby using the energy of the interrogating beam for the return communication link.

The devices can be fabricated using conventional photo-lithography techniques, and flip-chip bonded to corresponding driver/read-out circuitry. One of the distinguishing attributes of the present design is that the device requires no etching and does not have additional external reflective or anti-reflective layering.

Overview

In a quantum well, both the electron and the holes are confined in the direction perpendicular to the quantum well layers (the growth direction z) while still acting as free particles in the other two dimensions (x and y). The wave function of the electron is therefore a product of plane waves in the x and y directions multiplied by an envelope function in the z-direction, determined by the one-dimensional potential V(z) resulting from misalignment of band edges from well material to barrier material. The wave function and corresponding energy levels of the electron are solutions to the Schrödinger equation, modified by the fact that the in a heterostructure the effective mass is a function of z $$-\frac{\hbar^2}{2}\nabla\left(\frac{1}{m_i(z)}\nabla\psi_{i,n}\right) + V_i(z)\psi_{i,n} = E_{i,n}\psi_{i,n} \quad \text{(Equation 1)}$$

where index i refers to either the electron (e) or hole (h), $m_i(z)$ is the corresponding effective mass $V_i(z)$ is the potential due to the band-edge offset corresponding to conduction or valence band, between the well and barrier levels $E_{i,n}$ is the allowed energy value for the nth quantum state and $\psi_{i,n}$ is the corresponding wave function. Optical absorption in an undoped quantum well occurs by creating an exciton confined to the quantum well. Confined excitons are responsible for sharp peaks and fast drop in the absorption edge of the multiple quantum well structures.

Optical absorption in an undoped quantum well occurs by creating an exciton confined to the quantum well. Excitons are bound states (due to coulomb attraction) of electron hole-pairs generated by absorption of light. Excitons in bulk semiconductors typically have a weak influence on an optical absorption edge and are modified only slightly by an external electric field. In contrast, confined excitons modify the absorption edge pronouncedly by providing a sharp peak, and sharp cutoff in absorption. The quantum mechanical solution to optical absorption in a quantum well by excitons is treated in open literature, for example, *Physics of Optoelectronic Devices*, by Shun Lien Chuang, 1995 John Wiley.

A reverse bias voltage applied to a p-i-n structure can create a large external electric field (typically $10^5$ V/cm) of an external electric field in the i-region, and this has great influence on the confined excitons. The electric field polarizes the confined excitons and shifts the energy of the exciton towards lower energies and correspondingly, longer wavelength. This is called quantum confined Stark effect (QCSE). Therefore, a modulating reverse bias voltage can lead to modulation of absorption coefficient for a given wavelength. This can lead to the design of devices that can modulate transmitted light, or by putting a reflector behind the p-i-n structure, can create devices that can modulate the reflected light by different applied voltages. It is important to note that the resultant shift of the absorption edge due to an electric field bias is more pronounced in a confined quantum well and much less significant for excitons in bulk semiconductors.

Further enhancements of the contrast ratio are achieved by taking advantage of an optical resonant cavity. The modulator device described herein can be modeled as a partially reflective front surface (mirror), a fully reflective back mirror and a medium consisting of an absorbing layer (the MQW) and non-absorbing layers. The spectral reflectivity of such a device is a sensitive function of the front surface reflectivity, the overall thickness, and the thickness of the absorbing media as well as its absorption coefficient. The ratio of power lost in the modulator to incident power is given by:

$$\eta = \frac{P_l}{P_i} = \frac{(1-R_1)(e^{-\alpha_{ex}L_1} + R_2 e^{-\alpha_{ex}L_2}e^{-\alpha_c L})(1-e^{-\alpha d})}{(1+R_1 R_2 e^{-2\alpha d} - 2\sqrt{R_1 R_2}\, e^{-\alpha d} \cos(2\beta L + \psi_1 + \psi_2))} \quad \text{(Equation 2)}$$

with $$\alpha_c = \frac{\alpha_{ex}L_1 + \alpha_{ex}L_2 + \alpha d}{L} \text{ and } \beta = 2\pi n/\lambda c$$

The reflection coefficient is simply $1-\eta$. Here n is the index of refraction, c is the speed of light in vacuum $\alpha$ is the absorption coefficient of the active region which is of length d and $\alpha_{ex}$ is the absorption coefficients of the region between the active region and the two reflectors which are of distance $L_1$ from the top mirror and $L_2$ from the bottom mirror, and L=distance between top and bottom mirrors. $R_1$ and $R_2$ are the reflectivity of the front and back mirrors and $\psi_1$ and $\psi_2$ are associated phase shifts upon reflection from these mirrors, respectively. Typically the absorption in the layers surrounding the MQW are small and therefore $\alpha_{ex}$ can be neglected and $\alpha_c L$ is replaced by $\alpha d$.

It can be seen from the above that for a given $R_1$ and $R_2$, $2\beta L + \psi_1 + \psi_2 = 2m\pi$ gives the maximum value of quantum efficiency $\eta$, and corresponding minima in reflection (The reflection coefficient is simply $1-\eta$). Switching the absorption coefficient from low to high, lowers this dip further. Maximum contrast ratio is obtained at the wavelength corresponding to the minimum in the reflection. The challenge in the design of the optical cavity is to have the minimum reflectivity high enough (30–50%) in the ON state (low absorption regime), while lowering it significantly in the OFF state (high absorption regime). To calculate the change in the index of absorption from the change in the absorption coefficient, one can use Kramer-Kronig relations:

$$\Delta n(\omega) = \frac{c}{\omega\pi} P \int_0^\infty \frac{\omega' \Delta\alpha(\omega')}{\omega'^2 - \omega^2} d\omega'. \qquad \text{(Equation 3)}.$$

Typical values for $\Delta n$ are on the order of $10^{-3}$, and only in transmission line geometry can lead to any significant modulation.

Device Design and Fabrication

Figure 1:
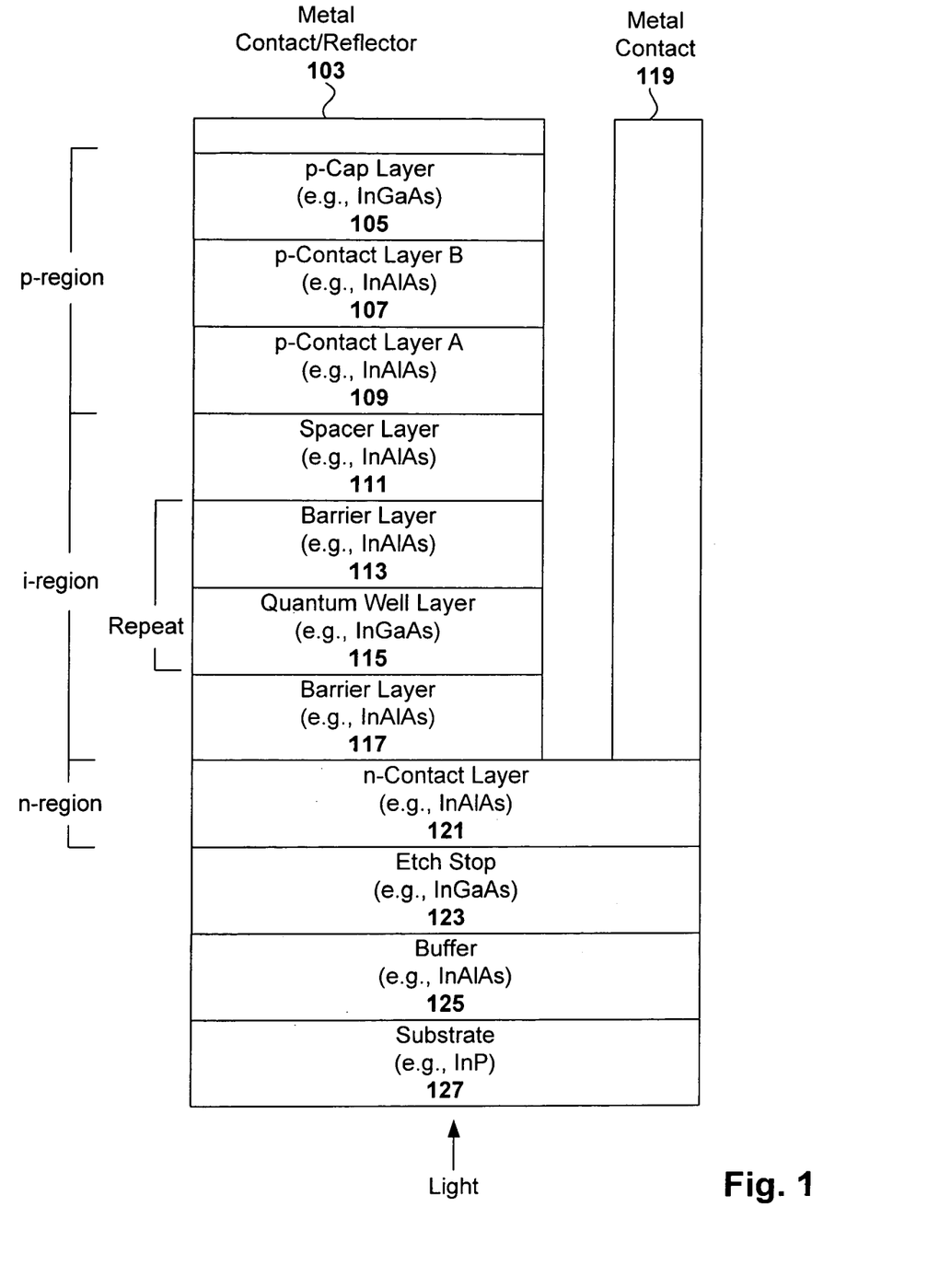
FIG. 1 is a cross-sectional view of a pixel included in a modulating reflector device configured in accordance with an embodiment of the present invention.
Figure 2:
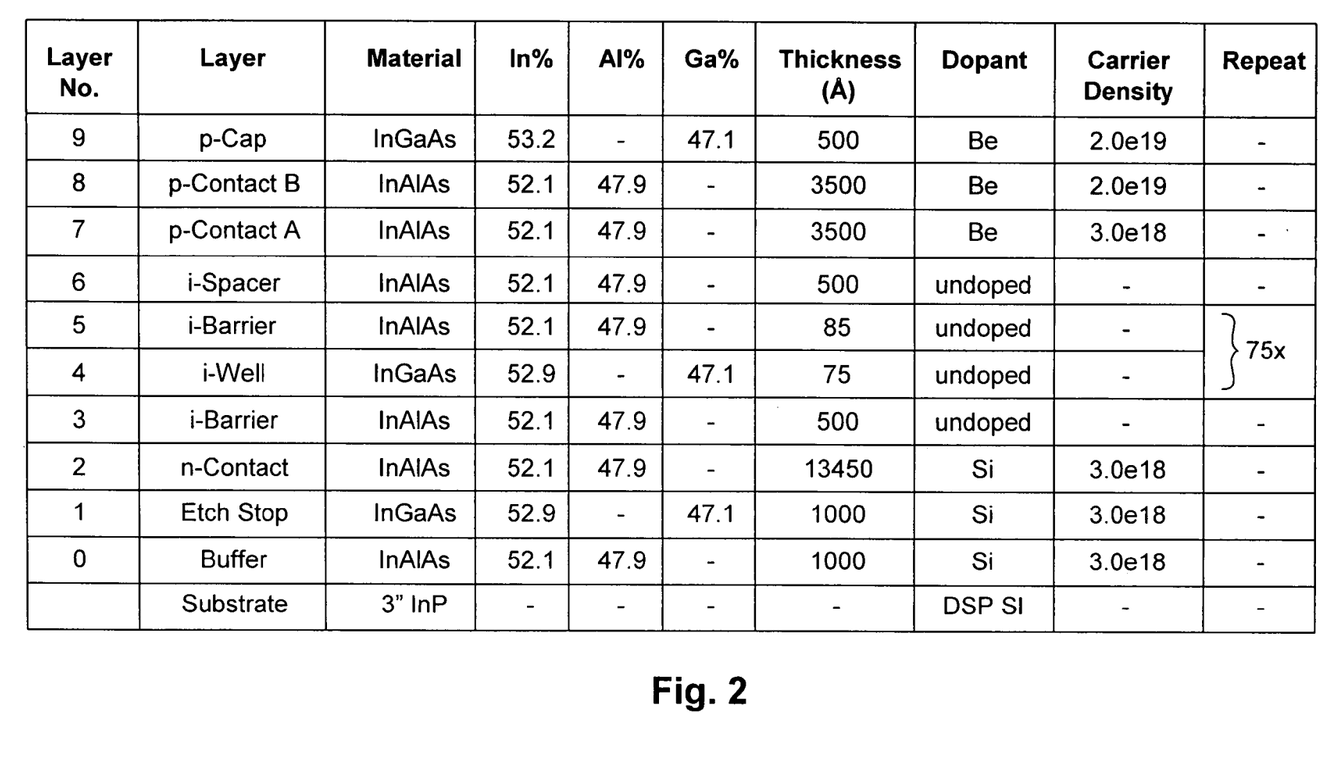
FIG. 2 is a semiconductor recipe for fabricating the pixels of the modulating reflector device shown in FIG. 1.

FIG. 1 is a cross-sectional view of one pixel included in a modulating reflector device configured in accordance with an embodiment of the present invention. An example recipe for fabricating this device is shown in FIG. 2, which shall be referred to in the description of each device layer.

As can be seen, each pixel of the modulator device is a p-i-n diode that includes an Indium Aluminum Arsenide and Indium Gallium Arsenide (InAlAs/InGaAs) MQW structure in the i-region and it is latticed matched or nearly lattice-matched to an Indium Phosphide (InP) substrate. The thickness of the MQW stack along with the p and n contact layers are designed as an overall resonant optical cavity to enhance the optical performance of the device. The p-i-n structure is grown on InP substrates (wafers) using molecular beam epitaxy (MBE) and contain a lattice matched InGaAs etch stop ensuring an optically flat surface once the substrate is removed. The wafers are then processed, for example, in two dimensional pixel arrays.

In more detail, the example configuration includes a 3 inch diameter InP substrate 127 on which an InAlAs buffer 125 is epitaxially grown. The substrate 127 can be, for example, a double sided polished (DSP) Silicon-doped InP (InP:Si) wafer or a semi-insulating InP wafer. From FIG. 2, the InAlAs buffer 125 can be comprised of 52.1% In and 47.9% Al, and has a thickness of 1000 Å. The dopant of the buffer 125 is Si with a carrier density of 3.0e18. Note that the substrate 127 and buffer layer 125 can be subsequently removed once the photolithographic processing is completed.

An InGaAs etch stop layer 123 is epitaxially grown on the buffer 125, and includes 52.9% In and 47.1% Ga, and has a thickness of 1000 Å. The dopant of the etch stop layer 123 in this particular example is Si with a carrier density of 3.0e18. A relatively thick InAlAs n-contact layer 121 is then epitaxially grown on the etch stop layer 123. In particular, the n-contact layer 121 of this example is comprised of 52.1% In and 47.9% Al, and has a thickness of 13,450 Å. The dopant of the n-contact layer 121 is Si with a carrier density of 3.0e18.

An InAlAs barrier layer 117 is epitaxially grown on the n-contact layer 121, and includes 52.1% In and 47.9% Al, and has a thickness of 500 Å. The barrier layer 117 forms part of the intrinsic region (i-region) of the p-i-n diode, and is therefore undoped. An InGaAs quantum well layer 115 is then epitaxially grown on the barrier layer 117. The quantum well layer 115 of this example is comprised of 52.9% In and 47.1% Ga, and has a thickness of 75 Å. The quantum well layer 115 forms part of the i-region of the p-i-n diode, and is therefore undoped.

An InAlAs barrier layer 113 is epitaxially grown on the quantum well layer 115, and includes 52.1% In and 47.9% Al, and has a thickness of 85 Å. The barrier layer 113 forms part of the i-region of the p-i-n diode, and is therefore undoped. Note that for each pixel of the device, the quantum well layer 115 and barrier layer 113 are repeated a number of times. In the particular recipe shown in FIG. 2, there are seventy-five cycles of the quantum well layer 115 and barrier layer 113. Other embodiments can have a different number of cycles (e.g., 20 cycles or 150 cycles).

An InAlAs spacer layer 111 is then epitaxially grown on the last barrier layer 113 in the stack to provide additional thickness to that barrier layer 113. The spacer layer 111 of this example is comprised of 52.1% In and 47.9% Al, and has a thickness of 500 Å. The spacer layer 111 forms part of the i-region of the p-i-n diode, and is therefore undoped.

A heterostructure is then grown to provide the p-contact layers A and B. In particular, a first InAlAs p-contact layer 109 is epitaxially grown on the spacer layer 111, and is comprised of 52.1% In and 47.9% Al, and has a relatively high thickness of 3500 Å. The dopant of the p-contact layer 109 is Beryllium (Be) with a carrier density of 3.0e18. A second InAlAs p-contact layer 107 is epitaxially grown on the p-contact layer 109. Like the p-contact layer 109, the p-contact layer 107 is comprised of 52.1% In and 47.9% Al, and has a relatively high thickness of 3500 Å. The dopant of the p-contact layer 107 is Be with a carrier density of 2.0e19.

An InGaAs p-cap layer 105 is epitaxially grown on the p-contact layer 107, and is comprised of 53.2% In and 47.1% Ga, and has a thickness of 500 Å. The dopant of the p-cap layer 105 is Be with a carrier density of 2.0e19. A first metal contact layer 103 is deposited on the p-cap layer 105. A second metal contact layer 119 is deposited on the n-contact layer 121. These metal contacts 103 and 119 can be, for example, gold (Au) or other suitable contact metal.

Note that the metal contacts 103 and 119 can be fabricated to provide contact points within the same plane of the device (which in this case is at the p-cap layer 105), thereby facilitating the hybridization of the device (e.g., flip-chip bump bonding to a driver/readout circuit). It will be appreciated that no particular scale is intended by FIG. 1, which was drawn to readily illustrate the various layers making up the pixel. Actual thicknesses of layers can be better seen with reference to FIG. 2. Each of the device layers is lattice-matched to InP in this example, and the thickness tolerance for each layer is about ±5%.

Further note that the metal contact 103 also acts as a reflector at the back of the pixel to enable the device to act as a reflector. A reflective coating (e.g., gold or other suitable reflective metal) on the sides of the pixel stack and/or around the perimeter of the side of the array comprising the pixels to further prevent lateral leakage of light, thereby improving absorption and reflectivity.

The devices can be fabricated using epitaxial techniques (such as MBE) and standard processing techniques such as photolithography, e-beam and thermal metal evaporation, lift off, and Reactive Ion Etching (with or without inductively coupled plasma (ICP)). For example, the recipe can be grown using MBE as p-i-n diode devices with the quantum well structure grown as the intrinsic region and processed into x by y array of pixels. Etching of the pixels can be done, for example, using Reactive Ion Etching including ICP. An optimized dry etch to isolate each pixel minimizes pixel cross talk and leakage current. Other suitable epitaxial, deposition, and removal techniques can be used here as well.

In one particular embodiment, each modulating reflector device is configured as an 8×8 array of pixels on 250 μm centers. Pixels can be individually addressed by holding the common layer (e.g., back gate or metal contact 119) at a fixed voltage and lowering the voltage of the specific target pixel (e.g., at metal contact 103). Therefore, all pixels can be biased and operated separately.

Once the wafers resulting from the photolithographic fabrication process are complete, the wafers are diced as conventionally done into individual 'x' by 'y' arrays. The individual arrays can then be flip-chip bonded to a driver/read-out integrated circuit and wicked with epoxy. When the epoxy is cured, the substrate 127 and buffer 125 can then be removed via a mechanical lap and wet chemical etch, thereby leaving an optically flat surface at the etch stop 123.

The recipe demonstrated in FIG. 2 embraces two separate physical models to optimize different optical properties of the resulting modulating reflector device: a quantum well model and a resonant optical cavity model. The quantum well model focuses on the absorption characteristics of the exciton and its response to impressed electric field via reverse biasing. In one particular case, the recipe is designed to tune the exciton energy to absorb at about 1.55 μm. The recipe was further designed to provide barrier and contact layer thicknesses using the resonant cavity model to enhance the optical resonance at 1.55 μm.

Generally stated, if the optical thickness of the pixel is commensurate with the target wavelength, then a resonance effect is provided that enhances reflection and contrast ratio. Contrast ratios can be calculated by dividing data (e.g., absorption or reflection data) collected without an applied bias by data with an applied bias. With no bias applied, there is minimal absorption and therefore high reflection (the light suffers little loss during the round trip to and from the back reflector). On the other hand, absorption is high and correspondingly reflection is low when a reverse bias is applied. A contrast ratio of 5:1 (or better) with an applied bias of 20 V was achieved using the growths that where designed to have a resonance at 1.55 μm.

Optical Communication Link: Detection and Modulation

Note that the current generated by the pixel without any applied bias increases with an increase in the intensity of the incident light on that pixel. Therefore, the device can act as its own detector without an applied bias, thereby allowing the device to remain idle while not being addressed by an interrogating laser beam or other light source. However, dormant pixels can also be reverse biased (e.g., 20 volts) if so desired, until the modulation mode. Upon detection of an incident light source, the device switches from detection mode to the modulation mode, whereby the active pixel is reverse biased at a given frequency (e.g., between 0 and 10 volts).

The summation of a reverse bias of 20 volts for the detector mode and a reverse bias of 0 to 10 volts for the modulator mode allows the pixel to be modulated in reverse bias between 10 and 20 volts, which is referred to as the operating voltage range for pixel modulation. The modulated reflected light (after being detected) is then sent back to the querying light source. The modulated light signal can then be viewed and analyzed for the information that it contains. After a specified time duration the modulation mode can be turned off, and the device switched back to detection mode (e.g., by operation of a local controller or processor).

Figure 3:
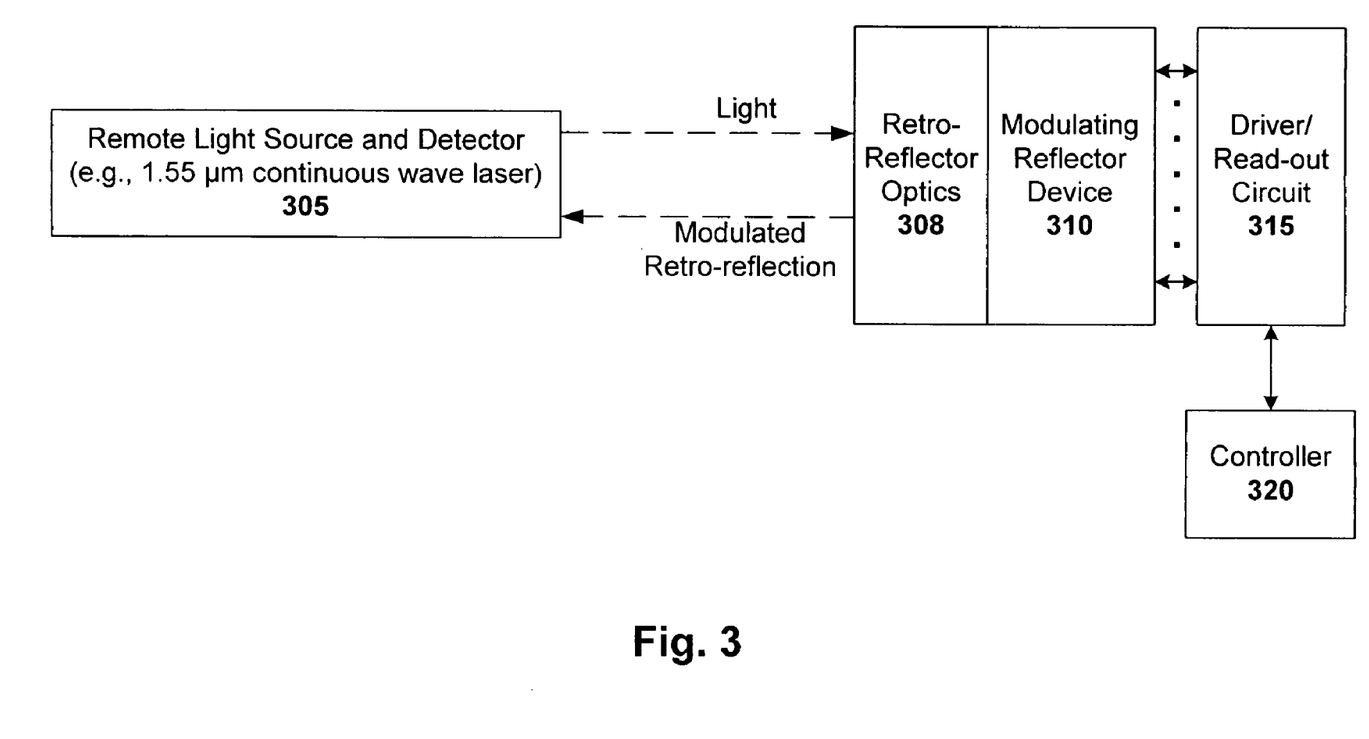
FIG. 3 is a block diagram of a communication system configured as a modulating retro-reflector device to realize an optical communication link in accordance with an embodiment of the present invention.

FIG. 3 is a block diagram of a communication system configured as a modulating retro-reflector device to realize an optical communication link in accordance with an embodiment of the present invention. As can be seen, the system includes a light source and detector 305 at a remote node, a modulating reflector device 310, retro-reflector optics 308, a driver/read-out circuit 315, and a controller 320.

Each of the light source and detector 305, the driver/read-out circuit 315, retro-reflector optics 308, and controller 320 can be implemented with conventional technology, while the modulating reflector device 310 is configured in accordance with the principles of the present invention. The combination of the modulating reflector device 310 and the retro-reflector optics implements a modulating retro-reflector device. In one particular application, for instance, the modulating reflector device 310 is an 8 by 8 pixel array that is configured pursuant to the recipe discussed in reference to FIG. 2.

The controller 320 is programmed or otherwise configured to query pixels of the modulating reflector device 310 until one or more of the pixels detects an input signal (light) from source 305 (e.g., 1.55 μm continuous wave laser). Here, the system is in detection mode. Recall that current generated by the pixel without any applied bias increases with an increase in the intensity of the incident light on that pixel. Therefore, the device can act as its own detector without an applied bias across the pixel 'p' and 'n' contact layers, thereby allowing the device to remain idle with no incident light. Alternatively, a constant reverse bias (e.g., 20 volts) can be applied across the pixel 'p' and 'n' contact layers, until the modulation mode.

Once one or more pixels signals detection of light, the controller 320 then switches to modulation mode and reverse biases the modulating retro-reflector device 308, 310 at a given frequency, so as to modulate the signal (modulated retro-reflection) that is returned by the retro-reflector device 308, 310. In this sense, the retro-reflector device 308, 310 returns a data packet of information. The modulation frequency can be, for example, programmed directly into the controller 320, or can be provided by a signal generator under direction of the controller 320.

It is also possible to have the dormant pixels in the reverse biased mode. Upon detection of interrogation light, the affected pixel generates a photocurrent which signals upon which the controller can apply a modulating voltage to increase or decrease the reverse bias on the said pixel. The modulated electric voltage signal is then converted to a modulated optical signal upon reflection.

The modulating retro-reflector device 308, 310 provides the capability for an optical communications system to include terminals that only modulate when activated by the energy of the interrogating light source (e.g., laser beam), thereby using the energy of the interrogating beam for the return communication link.

Testing has shown that devices configured in accordance with the recipe of FIG. 2 can be modulated at frequencies on the order of 100 MHz and higher. Capacitance and resistance measurements of these devices indicate an RC time constant of about 1 kHz, therefore having no limitations.

The flexibility associated with InGaAs/InAlAs MQW modulating retro-reflector devices described herein make them ideal for use in free space optical communications. Modulation of 1.55 µm light at rates of greater than 30 MHz achieved with 250 µm×250 µm devices prove that MQW structures aren't limited by an RC time constant. Additionally, contrast ratios of devices containing an overall resonant cavity were greater than three times than those without the cavity. Further enhancements to contrast ratios may be realized by designing a device that operates purely by shifting the resonance of an optical cavity thereby, reducing the operating voltage.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A modulating reflector optical communication device for realizing an optical communication link, comprising:
    an n-region contact layer epitaxially grown with InAlAs;
    an i-region configured to absorb light at a target wavelength and having a stack of InGaAs quantum well layer and InAlAs barrier layer cycles epitaxially grown on the n-region contact layer;
    a p-region contact layer having a structure epitaxially grown on the stack with InAlAs; and
    a first metal contact associated with the n-region contact layer, and a second metal contact associated with the p-region contact layer that also operates as a reflector;
    wherein thicknesses of the stack and contact layers provide an overall resonant optical cavity that enhances contrast ratio at the target wavelength, thereby allowing logical on and logical off states of the device to be resolved so as to enable an optical communication link; and
    wherein the structure of the p-region contact layer includes first and second InAlAs layers, each 3,000 to 4,000 Å thick, with the first InAlAs layer closest to the stack and having a carrier density that is higher than that of the second InAlAs layer.

2. The device of claim 1 wherein the n-region contact layer is 10,000 to 15,000 Å thick.

3. The device of claim 1 wherein the stack includes a first InAlAs barrier layer on the n-region contact layer that is 450 to 550 Å thick, followed by alternating InGaAs quantum well and InAlAs barrier layers each having thicknesses between 55 to 125 Å thick.

4. The device of claim 3 wherein the stack includes a last InAlAs barrier layer, the i-region further comprising an InAlAs spacer layer that is grown on the last InAlAs barrier layer and is 450 to 550 Å thick.

5. The device of claim 1 further comprising a p-cap layer epitaxially grown with InGaAs on the p-region contact layer, wherein the second metal contact is on the p-cap layer.

6. The device of claim 5 wherein the p-cap layer is 450 to 550 Å thick.

7. The device of claim 1 further comprising an InGaAs etch stop layer upon which the n-region contact layer is grown, wherein the etch stop layer is 500 to 1500 Å thick and doped similarly to the n-region contact layer.

8. The device of claim 1 wherein the target wavelength is in the range of 1550+20 nm.

9. The device of claim 1 further comprising a retro-reflector optics section coupled to said modulating reflector optical communication device.

10. A modulating reflector optical communication device for realizing an optical communication link, comprising:
    an n-region contact layer epitaxially grown with InAlAs that is 13,000 to 14,000 Å thick;
    an i-region configured to absorb light within a wavelength range of 1550+20 nm and having a stack that includes a first InAlAs barrier layer on the n-region contact layer that is 450 to 550 Å thick, followed by alternating InGaAs quantum well and InAlAs barrier layers each having thicknesses between 55 to 125 Å thick; and
    a p-region contact layer and also having a structure epitaxially grown on the stack with InAlAs, and including first and second InAlAs layers, each 3,000 to 4,000 Å thick;
    wherein the thicknesses of the stack and contact layers provide an overall resonant optical cavity that enhances contrast ratio of 5:1 or better within the 1550+20 nm wavelength range, thereby allowing logical on and logical off states of the device to be resolved so as to enable an optical communication link.

11. The device of claim 10 wherein the first InAlAs layer of the structure is closest to the stack and has a carrier density that is higher than that of the second InAlAs layer of the structure.

12. The device of claim 10 wherein the stack includes a last InAlAs barrier layer, the i-region further comprising an InAlAs spacer layer that is grown on the last InAlAs barrier layer and is 450 to 550 Å thick.

13. The device of claim 10 further comprising:
    a p-cap layer epitaxially grown with InGaAs on the p-region contact layer that is 450 to 550 Å thick; and
    a metal contact and reflector on the p-cap layer.

14. The device of claim 10 further comprising an InGaAs etch stop layer upon which the n-region contact layer is grown, wherein the etch stop layer is 500 to 1500 Å thick and doped similarly to the n-region contact layer.

15. A modulating retro-reflector optical communication device for realizing an optical communication link, comprising:
    a retro-reflector optics section;
    an InAlAs n-region contact layer;
    an i-region configured to absorb light at a target wavelength and having a stack of InGaAs quantum well layer and InAlAs barrier layer cycles on the n-region contact layer; and an InAlAs p-region contact layer on the stack;

wherein thicknesses of the stack and contact layers provide an overall resonant optical cavity that enhances contrast ratio at the target wavelength, thereby allowing logical on and logical off states of the device to be resolved so as to enable an optical communication link; and the p-region contact layer includes a structure having first and second InAlAs layers, each 3,000 to 4,000 Å thick, with the first InAlAs layer closest to the stack and having a carrier density that is higher than that of the second InAlAs layer; and the n-region contact layer is 10,000 to 15,000 Å thick.

16. The device of claim 15 wherein the stack includes a first InAlAs barrier layer on the n-region contact layer that is 450 to 550 Å thick, followed by alternating InGaAs quantum well and InAlAs barrier layers each having thicknesses between 55 to 125 Å thick, and the i-region further includes an InAlAs spacer layer that is grown on a last of the InAlAs barrier layers and is 450 to 550 Å thick.

17. The device of claim 15 further comprising:

an InGaAs etch stop layer upon which the n-region contact layer is grown, wherein the etch stop layer is doped similarly to the n-region contact layer and is 500 to 1500 Å thick;

a InGaAs p-cap layer on the p-region contact layer that is 450 to 550 Å thick; and a metal contact and reflector on the p-cap layer.

18. The device of claim 15 wherein the device operates in a detection mode until light is received from a remote node, and then switches to a modulation mode, where the device is biased at a given frequency thereby modulating light that is reflected back to the remote node.

19. The device of claim 18 wherein in the detection mode, the device is in a non-biased or reversed biased state, and in the modulation mode the device is reverse biased at the given frequency.

* * * * *

UNITED STATES PATENT AND TRADEMARK OFFICE
CERTIFICATE OF CORRECTION

PATENT NO. : 7,196,349 B2
APPLICATION NO. : 11/060191
DATED : March 27, 2007
INVENTOR(S) : Kambiz Alavi et al.

It is certified that error appears in the above-identified patent and that said Letters Patent is hereby corrected as shown below:

Column 3
Line 55, delete "Overview", insert -- Overview --

Column 5
Line 41, delete "Device Design and Fabrication", insert -- Device Design and Fabrication --

Column 7
Line 62, delete "Optical Communication Link: Detection and Modulation", insert -- Optical Communication Link: Detection and Modulation --

Column 10
Line 14, delete "+" insert -- ± --

Column 10
Line 25, delete "+" insert -- ± --

Column 10
Line 37, delete "+" insert -- ± --

Signed and Sealed this

Thirty-first Day of March, 2009

JOHN DOLL
*Acting Director of the United States Patent and Trademark Office*